United States Patent [19]

Ogasawara et al.

[11] Patent Number: 5,279,895

[45] Date of Patent: Jan. 18, 1994

[54] POLYIMIDE COMPOSITION AND PREPREG AND LAMINATE THEREOF

[75] Inventors: Kenji Ogasawara; Keiko Kashihara; Shingo Yoshioka, all of Kadoma, Japan

[73] Assignee: Matsushita Electric Works, Ltd., Osaka, Japan

[21] Appl. No.: 858,511

[22] Filed: Mar. 27, 1992

[30] Foreign Application Priority Data

Mar. 29, 1991 [JP] Japan .................................. 3-66363
Oct. 17, 1991 [JP] Japan ................................ 3-269558
Jan. 17, 1992 [JP] Japan .................................... 4-6286

[51] Int. Cl.$^5$ ........................ B32B 3/26; C08G 73/10
[52] U.S. Cl. ............................... 428/313.3; 428/313.9; 428/458; 428/473.5; 428/325; 528/310; 528/322
[58] Field of Search .................... 428/313.3, 313.9; 528/310, 322

[56] References Cited

U.S. PATENT DOCUMENTS

4,956,393  9/1990  Boyd et al. .......................... 521/54

FOREIGN PATENT DOCUMENTS

57-18353  4/1982  Japan .

*Primary Examiner*—George F. Lesmes
*Assistant Examiner*—Chris Raimund
*Attorney, Agent, or Firm*—Stevens, Davis, Miller & Mosher

[57] ABSTRACT

A polyimide composition is prepared with a polyimide containing minute hollow spherules made of a glass of a hydroxyl group content and having less than 0.5 mg/m$^2$. A multilayer substrate for printed-wiring is prepared with this polyimide composition. The substrate possesses a low dielectric constant, dielectric dissipation factor and thermal expansion coefficient.

6 Claims, No Drawings

POLYIMIDE COMPOSITION AND PREPREG AND LAMINATE THEREOF

BACKGROUND OF THE INVENTION

This invention relates to a polyimide composition as well as a prepreg and laminate prepared from the composition.

The laminate prepared from the polyimide composition according to the present invention is useful as a material for manufacturing a multilayer substrate for printed-wiring used in electronic devices and equipment.

DESCRIPTION OF RELATED ART

In recent years, a demand for speedup in information processing prevails in the field of the electronic devices and equipment such as, in particular, computers, and there have been suggested various attempts to satisfy the demand. From a view point of the multilayer substrate for printed-wiring, it has been attempted to improve the velocity of propagation of electric signals, and effort has been made to lower the dielectric constant of insulating layers and to elevate the density of printed-wiring. In order to lower the dielectric constant, there has been suggested in, for example, Japanese Patent Publication No. 57-18353 of E. Sugita et al a substrate for printed-wiring board in which the object is to dispose a hollow spherule within a resin as admixed therewith.

In this substrate of Sugita et al, however, there has been a problem that, while the substrate realizes the low dielectric constant in the multilayer substrate, it is still necessary, in order to achieve high printed-wiring density to concurrently lower the dielectric dissipation factor of the multilayer substrate, but the substrate of Sugita et al does not achieve the required demanded level for the low dielectric dissipation factor.

It is well known for anyone skilled in the art to concurrently attain the low dielectric constant and low dielectric dissipation factor by preparing the multilayer substrate with a fluoroplastic as a material of the resin composition. However, this measure is still defective in that the particular multilayer substrate does not possess a satisfactory level in the dimensional stability or in the workability upon being subjected to a plating of wiring conductor, and this measure is not suitable for preparing the multilayer substrate having in particular, the high wiring density.

In attaining the high wiring density, it is also known to increase the number of layers forming the multilayer substrate. However, in this case it becomes necessary to ensure the thermal expansion coefficient of the insulating layers is as small as possible for the purpose of improving electromechanical reliability. For instance, in order to prevent any damage from occurring in plated conductor in through holes due to expansion and contraction accompanying a heat shock. In order to minimize the thermal expansion coefficient of the insulating layers, it is necessary to keep the thermal expansion coefficient of the materials forming the multilayer substrate small, and various attempts have been made in this respect.

SUMMARY OF THE INVENTION

A primary object of the present invention is, therefore, to provide a polyimide composition having a reduced dielectric constant, dielectric dissipation factor and thermal expansion coefficient, a prepreg obtained with the polyimide composition dried to a B-stage, and a laminate obtained with a plurality of such prepregs stacked and molded.

According to the present invention, this object can be realized by means of a polyimide composition characterized in that the composition comprises a polyimide and minute hollow spherules made of a glass having a hydroxyl group content of less than 0.5 mg/m$^2$.

Other objects and advantages of the present invention shall be made clear in following description of the invention, with reference to various working aspects of the invention.

While the present invention shall now be disclosed with reference to the respective working aspects, it should be appreciated that the intention is not to limit the invention only to such working aspects but rather to include all alterations, modifications and equivalent arrangements possible within the scope of appended claims.

DETAILED DESCRIPTION OF PREFERRED EMBODIMENTS

In the present invention, the polyimide composition provided as a material for the prepregs used in preparing the laminate contains minute hollow spherules of a glass, so that shell wall of the hollow spherule, which has a smaller thermal expansion coefficient than thermosetting polyimides, can restrain the thermal expansion coefficient of the polyimide composition and of the prepreg and laminate of this composition to be small. The glass-made minute hollow spherule is economical and high in the usefulness.

While not required to be specifically limited, the glass-made hollow spherule should preferably have an average particle diameter of less than 20 μm. When the average particle diameter is larger than this, the insulating properties between respective through holes may be damaged in the multilayer substrate, which is used in the printed wiring and formed with the laminate employed, and it has been unsatisfactory in respect of the reliability of the multilayer substrate for use in the printed wiring. For the true specific gravity of the glass-made minute hollow spherule, while not required to be specifically limited, the same should preferably be 0.3 to 1.4. If the true specific gravity is less than 0.3, a uniformly dispersed state of the spherule cannot be obtained in the polyimide composition, which is then dried to the B-stage and made to impregnate a base so as to form the prepreg, and thereby the prepreg is made to be no more uniform in its composition. When the true specific gravity is greater than 1.4, the glass-made minute hollow spherule possesses a large dielectric constant, so that there arises a problem, when the multilayer substrate is prepared, that a low dielectric constant cannot be attained. Further, while also not required to be specifically limited but may properly be selected, it is desirable that, for the type of the glass forming the shell wall of the hollow spherule and of a gas to be sealed within the spherule, the glass employed is preferably contains more than 90 weight % of SiO$_2$ and a small ratio of an oxide of alkali or of alkaline earth metal.

For the glass-made minute hollow spherule, the hydroxyl group content is less than 0.5 mg/m$^2$. For the purpose of rendering the hydroxyl group content less than 0.5 mg/m$^2$, the glass spherules are subjected to heat treatment. In executing this heat treatment, it becomes difficult to attain a hydroxyl group content of less than 0.5 mg/m² when the heating temperature falls below 400° C. and the heating time is shorter than 10 minutes. Furthermore, and when the heating temperature is below 400° C., a sufficiently low dielectric constant and dielectric dissipation factor cannot be realized in the eventual laminate. When, on the other hand, the heating temperature is greater than 800° C., fusing occurs between surfaces of the hollow spherules so as to render it difficult to uniformly disperse the hollow spherules within the polyimide. Accordingly, it is desirable to carry out the heat treatment at a temperature in a range of 400° to 800° C. for more than 10 minutes.

The foregoing value of the hydroxyl group content is obtained by dispersing the hollow spherule within a quantity of tetrahydrofuran, adding thereto LiAlH₄, measuring the generated volume of hydrogen, and obtaining a weight of the hydroxyl group per a unit area with use of a surface area value preliminarily obtained from the glass-made minute hollow spherule.

According to the present invention, there can be carried out a surface treatment with respect to the glass-made minute hollow spherule, so as to effectively prevent deterioration in the electric properties after a water absorption treatment of the laminate, which is executed when the hydroxyl group content is less than 0.5mg/m². For the type and amount of a coupling agent for use in the surface treatment as well as conditions for the treatment, it is not required to specifically limit them, while the coupling agent may be properly selected from treating silane compounds such as
hexamethyldisilazane,
trimethylchlorosilane,
trimethylmethoxysilane,
trimethylethoxysilane,
triethylmethoxysilane,
triethylethoxysilane,
dimethyldichlorosilane,
dimethyldiethoxysilane,
diethyldiethoxysilane,
methyltrichlorosilane,
ethyltrichlorosilane
and the like. The silane compound may have a functional group (for example, —CL, —OR, —NH and the like) which easily reacts to and is coupled to any silanol group present on a silica particle surface, and may not be limited to the above listed compounds.

Polyimides employable in the present invention will, while not being specifically limited, have low dielectric constants and are excellent in heat resistance, dimensional stability and workability. It will be possible in this case to employ, for example, an epoxy resin modified to lower its dielectric constant, instead of polyimide, but the present invention employs the latter in view of its required dielectric constant and/or economical advantage and so on. For polyimides, here, reaction products of bismaleimide and diamine may be effectively used. Bismaleimides are preferred, such as TECHMITE E-2020 (N,N'-4,4'-diaminodiphenylmethane-bismaleimide) having a structural formula

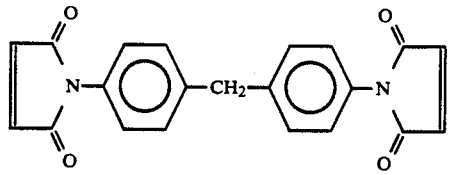

TECHMITE B-1000 (1,4-bis[2-P-(N-phenylmaleimide) propylidene]benzene) having a structural formula

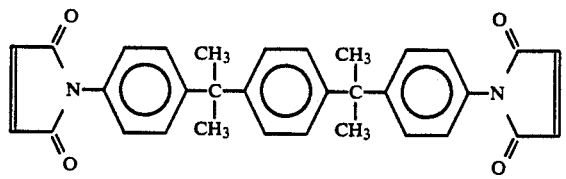

N,N'-ethylene-bis-imide maleate,
N,N'-hexamethylene-bis-imide maleate,
N,N'-methaphenylene-bis-imide maleate,
N,N'-para-phenylene-bis-imide maleate,
N,N'-4,4'-diphenylmethane-bis-imide maleate [also known as N,N'-methylene-bis(N-phenylmaleimide)],
N,N'-4,4'-diphenylether-bis-imide maleate,
N,N'-4,4'-diphenylsulfone-bis-imide-maleate,
N,N'-4,4'-dicyclohexylmethane-bis-imide maleate,
N,N'-αα-4,4'-dimethylenecyclohexane-bis-imide maleate,
N,N'-methaxylene-bis-imide maleate,
N,N'-diphenylcyclohexane-bis-imide maleate,
1,3-bis(2-p-anilinopropylidene)benzene-bis-imide,
1,4'-bis(2-p-anilinopropylidene)benzene-bis-imide,
1,4-bis(2-m-anilinopropylidene)benzene-bis-imide,
4,4'-methylene-di-2,6-xylidine-bis-imide,
4,4'-methylene-di-2,6-diethylaniline-bis-imide,
4,4'-diamino-3,3'-diethyl-5,5'-dimethyldiphenylmethane-bis-imide,
4,4'-methylene-di-2,6-diisopropylaniline-bis-imide,
2,5-dimethyl-p-phenylenediamine-bis-imide,
2,2-bis(4-aminophenyl)propane-bis-imide,
2,4-diaminomesitylene-bis-imide,
3,5-diethyl-2,4-tolylenediamine-bis-imide and the like.

The diamine, on the other hand, is preferably 1,3-bis(2-p-anilinopropylidene)benzene having a structural formula

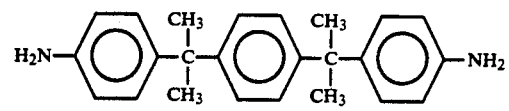

or compounds such as
1,4-bis(2-P-anilinopropylidene)benzene,
4,4'-diaminodicyclohexylmethane,
1,4-diaminocyclohexane,
2,6-diaminopyridine,
m-phenylenediamine,
p-phenylenediamine,
4,4'-diaminodiphenylmethane,
2,2-bis(4-aminophenyl)propane,
benzidine,
4,4'-diaminophenyl oxide,
4,4'-diaminodiphenyl sulfide, 4,4'-diaminodiphenyl sulfone,
bis-(4aminophenyl)diphenylsilane,
bis-(4-aminophenyl)methylphosphine oxide,
bis-(3-aminophenyl)methylphosphine oxide,
bis-(4-aminophenyl)phenylphosphine oxide,
bis-(4-aminophenyl)phenylamine,
1,5-diaminonaphthalene,
m-xylylenediamine,
p-xylylenediamine,
1,1-bis(p-aminophenyl)phthalane,
hexamethylenediamine,
1,3-bis(2-p-anilinopropylidene)benzene,
1,4-bis(2-m-anilinopropylidene)benzene,
4,4'-methylene-di-2,6-diethylaniline,
4,4'-diamino-3,3'-diethyl-5,5'-diphenylmethane,
4,4'-methylene-di-2,6-diisopropylaniline,
2,5-dimethyl-p-phenylenediamine,
2,2'-bis(4-aminophenyl)propane,
2,4-diaminomesitylene,
3,5-diethyl-2,4-tolylenediamine
and the like.

As has been described, the polyimide composition according to the present invention comprises, as essential components, polyimide and the glass-made minute hollow spherule, while the composition may also include a solvent, a setting assistant and the like as the occasion demands. The glass-made minute hollow spherule is used at a ratio with respect to the polyimide composition of 5 to 60% in volume percentage, since, with a ratio less than 5 vol. %, the lowering effect of the dielectric constant is insufficient and, with a ratio exceeding 60 vol. %, there arises an inconvenience that a uniformly composed polyimide composition can hardly be obtained. While a method for manufacturing this polyimide composition is not required to be specifically limited, the method should preferably include sufficient stirring and mixing to obtain the uniform composition. Further, in an event that the polyimide composition involves any foaming caused during the manufacturing steps, the composition should preferably be subjected to a defoaming or the like prior to the preparation of the prepreg.

In the present invention, the prepreg is prepared by having a base impregnated with the foregoing polyimide composition, and drying this composition to the B-stage. For the base employed here, while not required to be specifically limited, it is preferable to employ glass fibers, organic fibers or their mixture, from a view point of the low dielectric constant. Further, such glass fiber, organic fiber or their mixture may be either of a woven cloth or a non-woven cloth. The impregnation of the base with the polyimide composition may properly be carried out, if required, within a vacuumed atmosphere, while not specifically limited thereto. For conditions under which the polyimide composition after the impregnation is dried, it is preferable to carry out the drying at 120° at 180° C. for 3 to 30 minutes.

Such a prepreg prepared as in the above manner and a copper foil are stacked and are subjected to molding, and the laminate for use in preparing the printed wiring multilayer substrate is then prepared. It is preferable in this case to carry out the molding under conditions of a temperature in a range of 150° to 250° C. under a pressure of 5 to 40 kg/cm² for 1 to 4 hours.

EXAMPLES 1-11 & COMPARATIVE EXAMPLES 1-4

The polyimide composition was prepared with such various compositions as shown in TABLE I, throughout which, except for Comparative Example 1, there was employed as the glass-made minute hollow spherule a NIPCEL H-330 (a trademark of a product by a Japanese manufacturer NIPPON SILICA KOGYO) of an average particle diameter of 15 μm, a true specific gravity of 1.3 and $SiO_2$ composition of 95 wt. %. The hydroxyl group content in the glass-made minute hollow spherule in each Example was as shown in following TABLES II and III. Heat treatments were carried out by means of an electric furnace under respective conditions as shown in the Tables.

In Examples 1-6, 10 and 11 and in Comparative Examples 3 and 4, the glass-made minute hollow spherule subjected to the heat treatment but not to the surface treatment was used, but, in Examples 7-9, the hollow spherule subjected to both the heat treatment and surface treatment by means of the coupling agent was used. This surface treatment was executed by adding a silane coupling agent to the glass-made minute hollow spherule by 1 wt. % with respect to the spherule, and heating them. The coupling agent was hexamethyldisilazane $[(CH_3)_3Si-NH-Si(CH_3)_3]$ in Example 7, aminosilane in Example 8 and vinyltrimethoxysilane in Example 9. In Comparative Example 2, the glass-made minute hollow spherule was not subjected to either the heating or surface treatments.

Polyimide employed in Examples 1-11 and Comparative Examples 1-4 was a thermosetting resin the main components of which were bismaleimide and diamine. More practically, the foregoing TECHMITE E-2020 (a trademark of a product by a Japanese manufacturer MITSUI SEKIYU KAGAKU KOGYO, which shall be hereinaafter referred to simply as "P-1") was used in Examples 1-9 and Comparative Examples 1-4, and another foregoing TECHMITE B-1000 (a trademark of a product of the same manufacturer as P-1 and which shall be hereinafter referred to as "P-2" and having a lower dielectric constant than P-1) was used in Examples 10 and 11. In Examples 1-11 and Comparative Examples 1-4, the solvent used was dimethylfolmamide (which shall be hereinafter referred to as "DMF") and the setting assistant used was 1B2MZ (a trademark of a product by a Japanese manufacturer SHIKOKU KASEI KOGYO) which was an imidazole, that is, 1-benzol-2-methylimidezol.

Through these Examples 1-11 and Comparative Examples 1-4, the various polyimide compositions were obtained, and the prepregs and laminates were further obtained with such compositions, upon which polyimide and the solvent were first heated at 90° C., stirred into a uniform solution, and the solution was then cooled to below 40° C. Thereafter, the setting assistant was added to the cooled solution, which was then stirred into a uniform solution, the glass-made minute hollow spherule was added into this solution, and they were fully mixed and stirred. The solution was then subjected to defoaming under a vacuumed state to discharge any foam caused to be involved during the stirring, and the respective polyimide compositions were obtained. The ratio of the glass-made minute hollow spherule with respect to the solid component in the respective polyimide compositions was as shown in TABLES II and III.

The thus obtained polyimide compositions were then used for the impregnation of such glass cloths made of E-glass or D-glass as shown in TABLES II and III. The compositions were dried at 160° C. for 7 minutes to remove the solvent forming a volatile content, and various prepregs were obtained. For the glass cloth of E-glass, a flat waven glass cloth of 94 g/m² was used. For the glass cloth of D-glass, and, for the glass cloth of D-glass of a lower dielectric constant than the E-glass, another flat waven glass cloth of 84 g/m² was employed.

Then, four of the thus obtained prepregs were stacked on each other, a copper foil of 18 μm thick was placed on each of the top and bottom surfaces of the stacked prepregs. The obtained stack of the prepregs and copper foils was subjected to a molding between a pair of stainless steel plates under molding conditions of 200° C. and 20 kg/cm² for 2 hours, and a copper clad laminate was obtained. Contents (in volume %) of the minute hollow spherule within the substrate in each of the thus obtained copper clad laminates of the various polyimide compositions, except for the copper foils, and various properties of the entire copper clad laminates as well as the substrate portions, except for the copper foils, were measured. The results as shown in TABLES II and III. For the dielectric constant and the dielectric dissipation factor, the measurement was made in accordance with Japanese Industrial Standard JIS-C-6481 while the oven heat resistance shown in these TABLES II and III was determined such that samples of 50 mm square were cut out of the respective copper clad laminates, these samples were respectively placed in each of thermostatic chambers respectively kept at the following temperatures: 250° C., 260° C., 270° C., 280° C., 290° C. and 300° C. The samples were taken out of the chambers after 30 minutes, and an investigation was carried out to see which samples did not exhibit blister or peeling, and the highest temperature involving no blister or peeling was determined to be the oven heat resistance.

TABLE I

| | Example No. | | | | |
|---|---|---|---|---|---|
| | 1 | 2 | 3, 5–11 | 4 | Comp. Example No. |
| | | | | | 2–4 | 1 |
| Polyimide (g) | 490.5 | 439.1 | 382.9 | 348.8 | 620.0 |
| Solvent (DMF) (g) | 300.6 | 269.2 | 234.7 | 213.9 | 380.0 |
| Glass-made Hollow Spherule (g) | 209.4 | 291.6 | 381.4 | 434.5 | 0 |
| Setting Assistant (g) | 0.59 | 0.53 | 0.46 | 0.42 | 0.74 |
| Ratio of Glass-made Hollow Spherule with respect to Solid Content (vol. %) | 30 | 40 | 50 | 55 | 0 |

In measuring the thermal expansion, incidentally, a thermal analysis station TAS100 (a trademark of a product by Japanese manufacturer RIGAKU) was employed in a temperature range of 100° to 200° C.

TABLE II

| | Ex. No. | | | | | | | | | | |
|---|---|---|---|---|---|---|---|---|---|---|---|
| | 1 | 2 | 3 | 4 | 5 | 6 | 7 | 8 | 9 | 10 | 11 |
| Hydrx. Grp. Cont. (mg/m²) | 0.4 | 0.4 | 0.4 | 0.4 | 0.2 | 0.4 | 0.4 | 0.4 | 0.4 | 0.4 | 0.4 |
| Heat Trtmnt. Condtns. for Hol. Sphrl. (°C., Hrs.) | 700 2 | 700 2 | 700 2 | 700 2 | 700 2 | 750 2 | 700 2 | 700 2 | 700 2 | 700 2 | 700 2 |
| Surf. Trmnt. of Hol. Sph. | non | non | non | non | non | non | yes | yes | yes | non | non |
| Resin Used | P-1 | P-1 | P-1 | P-1 | P-1 | P-1 | P-1 | P-1 | P-1 | P-2 | P-2 |
| Ratio of Hol. Sph. to Sld. Comp. (vol. %) | 30 | 40 | 40 | 55 | 50 | 50 | 50 | 50 | 50 | 50 | 50 |
| Compstn. of Gls. of Base | E | E | E | E | E | E | E | E | E | E | D |
| Hol. Sphrl. Cont. in Lam. Subsrt. (vol. %) | 20 | 30 | 40 | 44 | 40 | 40 | 40 | 40 | 40 | 40 | 40 |
| Dielec. Const.: | | | | | | | | | | | |
| Norml. St. | 3.43 | 3.31 | 3.20 | 3.16 | 3.20 | 3.19 | 3.23 | 3.22 | 3.23 | 3.10 | 2.90 |
| Aft. Wtr. Absrptn. | 3.43 | 3.32 | 3.22 | 3.18 | 3.21 | 3.20 | 3.23 | 3.22 | 3.24 | 3.03 | 2.93 |
| Dielec. Dispn. Factor: | | | | | | | | | | | |
| Norml. St. | .0033 | .0033 | .0035 | .0037 | .0032 | .0025 | .0035 | .0036 | .0035 | .0041 | .0031 |
| Aft. Wtr. Absrptn. | .0035 | .0036 | .0037 | .0040 | .0034 | .0028 | .0035 | .0036 | .0036 | .0044 | .0033 |
| Therm. Expsn. Coeff. In Thick Drctn. (ppm/°C.) | 48 | 36 | 30 | 25 | 31 | 36 | 30 | 31 | 36 | 36 | 31 |
| Oven Heat Resist. (°C.) | 270 | 260 | 260 | 250 | 260 | 260 | 270 | 280 | 270 | 260 | 260 |

TABLE III

| | Comp. Ex. No. | | | |
|---|---|---|---|---|
| | 1 | 2 | 3 | 4 |
| Hydrx. Grp. Cont. (mg/m²) | — | 1.7 | 0.8 | 0.6 |
| Heat Trtmnt. Condtn. for Hol. Sphrl. (°C., Hrs.) | — | non | 200 2 | 350 2 |
| Surf. Trtmnt. of Hol. Sph. | — | non | non | non |
| Resin Used | P-1 | P-1 | P-1 | P-1 |
| Ratio of Hol. Sph. to | 0 | 50 | 50 | 50 |

TABLE III-continued

| | Comp. Ex. No. | | | |
|---|---|---|---|---|
| | 1 | 2 | 3 | 4 |
| Sol. Comp. (vol. %) | | | | |
| Compstn. of Gls. of Base | E | E | E | E |
| Hol. Sph. Cont. in Lam. Subsrt. (vol %) | 0 | 40 | 40 | 40 |
| Dielec. Const.: | | | | |
| Norm. St. | 4.16 | 3.68 | 3.41 | 3.29 |
| Aft. Wtr. Absrptn. | 4.16 | 3.68 | 3.44 | 3.34 |
| Dielec. Dispn. Fac.: | | | | |
| Norm. St. | .0039 | .027 | .017 | .014 |
| Aft. Wtr. Absrptn. | .0040 | .028 | .019 | .016 |
| Therm. Expsn. Coeff. in Thick. Drctn. (ppm/°C.) | 62 | 32 | 32 | 36 |
| Oven Heat Resist. (°C.) | 300 | 250 | 260 | 260 |

As will be clear from the above TABLE III, Comparative Example 2, for example, shows lower dielectric constant and thermal expansion coefficient than those in Comparative Example 1, that is, the addition and admixture the minute glass-made hollow spherule to the resin is effective to lower the dielectric constant and thermal expansion coefficient. In respect of the dielectric dissipation factor, Comparative Example 2 shows a higher value than that in Comparative Example 1, that is, the to admixture of the minute glass-made hollow spherule is not always effective to lower the dielectric dissipation factor.

Further, as will be clear from TABLES II and III, it has been found, from the measurement of Examples 3 and 6 and Comparative Examples 2 and 3 which are different only in the hydroxyl group content of the glass-made hollow spherule, that the dielectric dissipation factor is caused to be lower as the hydroxyl group content becomes smaller, in particular, when the hydroxyl group content is made less than 0.5 mg/m$^2$, the dielectric dissipation factor is abruptly lowered. Accordingly, it has been confirmed that a laminate showing low values in both the dielectric constant and dielectric dissipation factor and also having a function of the smaller thermal expansion coefficient can be realized by mixing with polyimide the minute glass-made hollow spherule showing the hydroxyl group content less than 0.5 mg/m$^2$.

As will be further clear from TABLE II, it has been also confirmed from the measurements of Examples 1 to 4 that, when the hydroxyl group content of the minute glass-made hollow spherule is equal but the mixing ratio of the glass-made hollow spherule to polyimide varies the thermal expansion coefficient in thickness direction of the eventually obtained laminate is made smaller as the containing ratio of the minute glass-made hollow spherule is increased. It has been further found that the hydroxyl group content in the case of Example 5, in which the heat treatment of the hollow spherule for controlling the hydroxyl group content was carried out at 700° C. for 7 hours, was equal to that in the case of Example 3, in which the heat treating conditions were 700° C. and 2 hours, the hydroxyl group content did not vary even when the heat. treatment was carried out much longer than a certain number of hours.

In Examples 7, 8 and 9, the hollow spherule was subjected to the surface treatment with a coupling agent, and it has been found that any deterioration in the dielectric constant or dielectric dissipation factor after the water absorption treatment could be prevented by means of the surface treatment. In Example 10, the P-2 polyimide low in the dielectric constant was employed and, in Example 11, the P-2 polyimide low in the dielectric constant as well as the D-glass base also low in the dielectric constant were employed, as the result of which it has been found that the eventually obtained laminate showed the dielectric constant of such extremely excellent level as being less than 3.1.

What is claimed is:

1. A polyimide composition comprising a polyimide and minute hollow spherules made of a glass containing more than 90 weight % of SiO$_2$ and having a hydroxyl group content less than 0.5 mg/m$^2$ wherein the hollow spherules are present in a range of 5 to 60 volume % with respect to said polyimide.

2. The composition of claim 1 wherein said hollow spherules are subjected to a surface treatment with a surface treating agent.

3. The composition of claim 2 wherein said surface treating agent is a silane compound having a functional group easily reacted with and coupled to any silanol group present on a silica particle surface.

4. The composition of claim 1 wherein said hollow spherules are subjected to a heat treatment at a temperature in a range of 400° to 800° C. for more than 10 minutes.

5. A prepreg for use in a printed wiring board, the prepreg comprising a polyimide composition containing a polyimide and minute hollow spherules made of a glass containing more than 90 weight % of SiO$_2$ and having a hydroxyl group content less than 0.5 mg/m$^2$, and a base impregnated with said polyimide composition and dried, said minute hollow spherules having an average particle diameter less than 20 μm and a true specific gravity in a range of 0.3 to 1.4, and polyimide being a reaction product between bismaleimide and diamine.

6. A laminate comprising a stack of a plurality of prepregs and a copper foil provided at least on one surface of said stack under pressure, said prepregs respectively comprising a base impregnated with a polyimide composition containing a polyimide and minute hollow spherules made of a glass containing more than 90 weight % of SiO$_2$ and having a hydroxyl group content less than 0.5 mg/m$^2$.

* * * * *